United States Patent
Chan et al.

(10) Patent No.: US 8,543,714 B2
(45) Date of Patent: Sep. 24, 2013

(54) LOCAL POWER MANAGEMENT UNIT AND POWER MANAGEMENT SYSTEM EMPLOYING THE SAME

(75) Inventors: Chih-Chiang Chan, Taoyuan Hsien (TW); Meng-Wen Pan, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 483 days.

(21) Appl. No.: 12/828,848

(22) Filed: Jul. 1, 2010

(65) Prior Publication Data

US 2011/0218689 A1    Sep. 8, 2011

Related U.S. Application Data

(60) Provisional application No. 61/310,953, filed on Mar. 5, 2010.

(51) Int. Cl.
*G06F 15/16* (2006.01)

(52) U.S. Cl.
USPC .................. 709/229; 709/223; 370/389

(58) Field of Classification Search
USPC .................. 709/223, 229; 370/389
See application file for complete search history.

(56) References Cited

U.S. PATENT DOCUMENTS

| 7,715,207 B2 * | 5/2010 | Behrens et al. ............... 361/788 |
| 2007/0140238 A1 * | 6/2007 | Ewing et al. .................. 370/389 |
| 2010/0019575 A1 * | 1/2010 | Verges ............................ 307/38 |

FOREIGN PATENT DOCUMENTS

| CN | 101640345 | 2/2010 |
| CN | 101640488 | 2/2010 |

* cited by examiner

*Primary Examiner* — El Hadji Sall
(74) *Attorney, Agent, or Firm* — Kirton McConkie; Evan R. Witt

(57) ABSTRACT

Disclosed is a local power management unit acting as a hub-like information agent for assisting a remote management system to administer power distribution units. One local power management unit is connected to a plurality of power distribution units through a peripheral communication interface and connected to the remote management system through an IP network. The local power management unit is configured to collect and analyze the operational data or power consumption information of the connected power distribution units through the peripheral communication interface and transmitted the processed data or information to the remote management system through the IP network. Hence, the workload of the remote management system is alleviated, the network cabling is saved, and the processing time of the polling operation carried out by the remote management system is shortened.

19 Claims, 4 Drawing Sheets

LOCAL POWER MANAGEMENT UNIT AND POWER MANAGEMENT SYSTEM EMPLOYING THE SAME

CROSS-REFERENCE TO RELATED APPLICATION

This application claims the benefit of U.S. Provisional Application No. 61/310,953, filed on Mar. 5, 2010, and entitled "LOCAL POWER MANAGEMENT UNIT AND POWER MANAGEMENT ARCHITECTURE EMPLOYING THE SAME", the entirety of which is hereby incorporated by reference.

FIELD OF THE INVENTION

The present invention relates to a power management system, and more particularly to a local power management unit and a power management system employing the same.

BACKGROUND OF THE INVENTION

Power distribution units (PDUs) have been employed to supply power to electronic equipment in racks and to remotely monitor and control the supply of power to the equipment. A conventional power distribution unit is an assembly of multiple electrical outlets (i.e. receptacles) that receive electrical power from a power source and distribute the electrical power via the plural outlets to the electronic equipment, for example data-processing equipment having respective power cords being plugged into respective outlets of the power distribution unit. The power distribution unit further includes a power management circuitry that can power-on and power-off the power outlets in accordance with an administrator defined sequence and delays. The power management circuitry can further sense electrical current drawn by the electronic equipment and control operation of the power distribution unit based on the sensed electrical current. The power distribution unit can be used in any of various applications and setting such as, for example, in or on electronic equipment racks, among other applications. The power distribution unit located in a cabinet may be used to control other devices such as environmental sensors, for example temperature sensors and humidity sensors, fuse module or communication modules and the like. A plurality of PDUs and other devices to which it is connected are commonly enclosed within an equipment rack or equipment cabinet.

The power distribution units, which are enclosed within an equipment rack or located at different equipment racks, are capable of directly communicating with a remote management system (RMS) via a network. The RMS sends/receives communication data, commands or information to/from the power distribution units through IP communication protocol with a unique IP address for each PDU. A conventional topology for power management device is given in U.S. Patent Publication No. 2007/0140238 to Ewing et al. The representative figure of this prior art reference is depicted as FIG. 1 of the invention. FIG. 1 shows a remote management system employed for coupling with and managing a plurality of PDUs. A remote management system (RMS) may be configured for various kinds of user interactions. Generally, the RMS is provided as an Internet-based application that communicates with client browsers through web server. Each PDU may comprise one or more electrical outlets and sensors that indicate voltage present at the outlets and current flow through each outlet. Each PDU may transmit the operational data or power consumption information of each outlet to the RMS via the network 102 so that RMS can manage and control the operations of the PDUs based on the data or information.

Please refer to FIG. 1 again. The power management system 100 includes a RMS including a host system 101 connected over a network 102 to a controlled system 103 including one or more PDUs and computer-based appliances. A power manager circuit 104, e.g., power distribution unit (i.e. power distribution strip), is used to monitor and control the operating power supplied to a plurality of computer-based appliances 105 associated with a network interface. The role and purpose of the power management system 100 is to monitor the power and environmental operating conditions in which the computer-based appliances 105 operate, and to afford management personnel the ability to turn the computer-based appliances 105 on and off from the host system 101. Such power-cycling allows a power-on rebooting of software in the computer-based appliances 105 to be forced without actually having to visit the site. The operating conditions and environments are preferably reported to the host system 101 on request and when alarms occur.

The power manager circuit 104 (i.e. PDU) further comprises a network interface 1041 and this may be connected to a security device 1042. If the network 102 is the internet, the security device 1042 can provide protection of a protocol stack 1043 from accidental and/or malicious attacks. The protocol stack 1043 is coupled to a power manager 1044, and it converts software commands communicated to the form of IP data packets 106 that the power manager 1044 can use. For example, message can be sent from the host system 101 that will cause the power manager 1044 to operate the relay-switch 1045. In reverse, voltage, current and temperature information collected by the sensors 1046 are collected by the power manager 1044 and encoded by the protocol stack 1043 into appropriate data packets 106. Locally, a keyboard 1047 can be used to select a variety of readouts on a display 1048, and also to control the relay-switch 1045.

Currently, the RMS uses IP networks to manage a multiplicity of PDUs. Namely, all alarm, events, and commands are sent/received between RMS and each individual PDU and connect them with IP networks. This approach will result in a very long response time because RMS has to receive all the operational data or power consumption information about the outlets of the PDUs from the PDUs and check each PDU and other power device in a round-robin or prioritized round-robin style. In addition, the data processing burden on the RMS will be increased and the physical connections between the PDUs with the network will be complex and costly.

To overcome the disadvantages of the prior art described above, the present invention provides a local power management unit and a power management system employing the same.

SUMMARY OF THE INVENTION

An object of the invention is to provide a local power management unit acting as a hub-like information agent between a remote management system and a plurality of power distribution units. The inventive local power management unit is used to connect to a plurality of power distribution units at the local side of the power distribution units and collect and analyze the operational data or power consumption information of the power distribution units, thereby enabling the remote management system to manipulate the power distribution units according to the data collected by the local power management unit.

Another object of the invention is to provide a power management system having a local power management unit functioning as a hub-like information agent for connecting to a plurality of power distribution units and collecting and analyzing the required data associated with the manipulation of the power distribution units for a remote management system to administrate the power distribution units.

A pristine aspect of the invention is directed to a local power management unit connected to a remote management system for regulating a plurality of power distribution units under the administration of the remote management system. The local power management unit includes an internal communication bus configured to connect to a plurality of power distribution units and proceed to data communication with the plurality of power distribution units, a controller connected to the internal communication bus for collecting and analyzing the information received from the plurality of power distribution units through the internal communication bus, and in response thereto outputting the information processed by the controller to the remote management system, and a network communication bus connected to the controller and the remote management system for transmitting the information processed by the controller to the remote management through an internet protocol network.

A broader aspect of the invention is directed to a power management system for remotely administrating a plurality of power distribution units. The power management system includes an internet protocol network, a remote management system configured to allow an administer to control the power distribution units through the internet protocol network, and a local power management unit connected to the remote management system through the internet protocol network and connected to the plurality of power distribution units through a peripheral communication interface for collecting and analyzing the operational data or power consumption information of the plurality of power distribution units and in response thereto transmitting the data or information processed therein to the remote management system through the internet protocol network.

Now the foregoing and other features and advantages of the present invention will be best understood through the following descriptions with reference to the accompanying drawings, wherein:

DESCRIPTION OF THE PREFERRED EMBODIMENT

Figure 1:
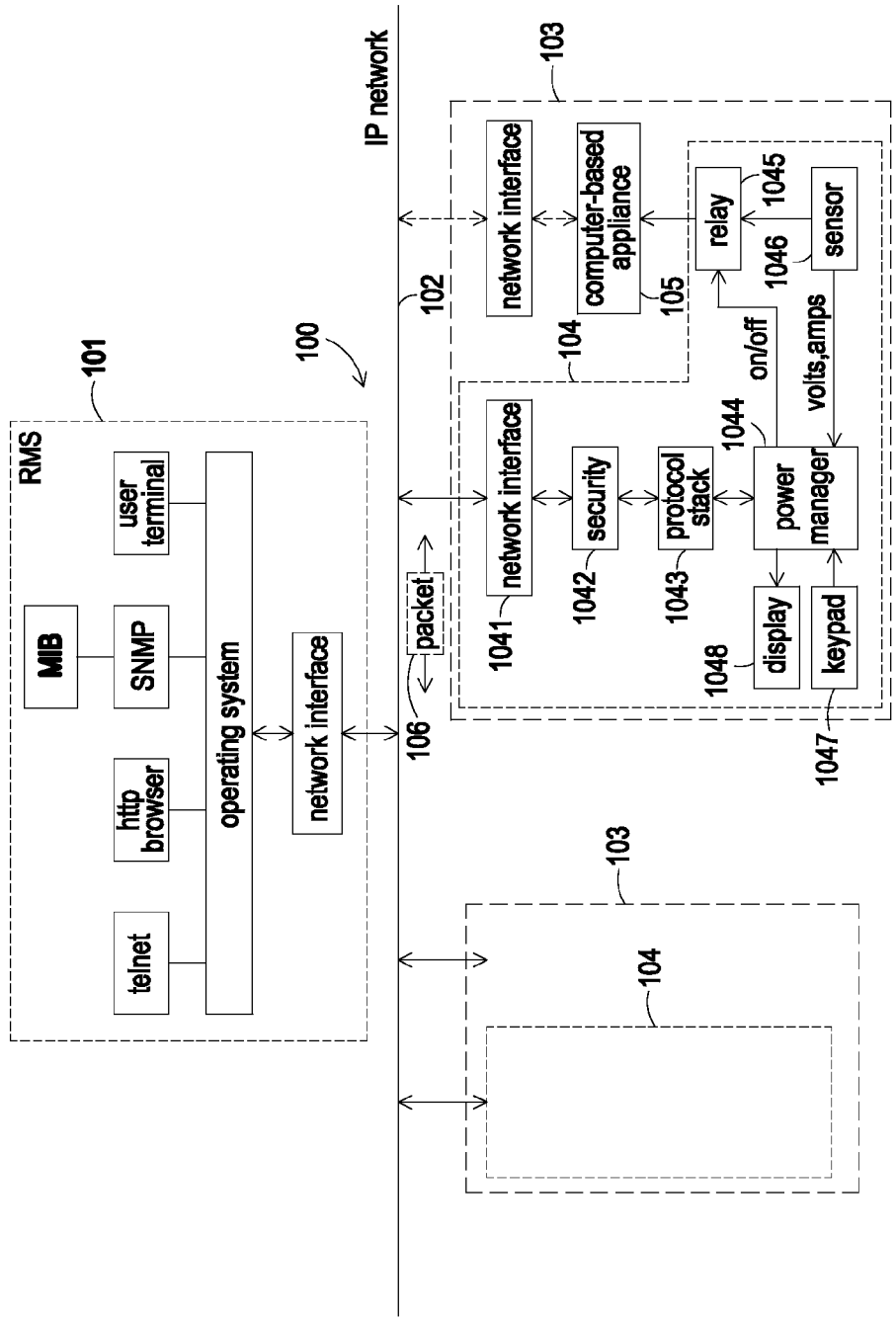
FIG. 1 shows a remote management system employed for coupling with and managing a plurality of PDUs according to the prior art.
Figure 2:
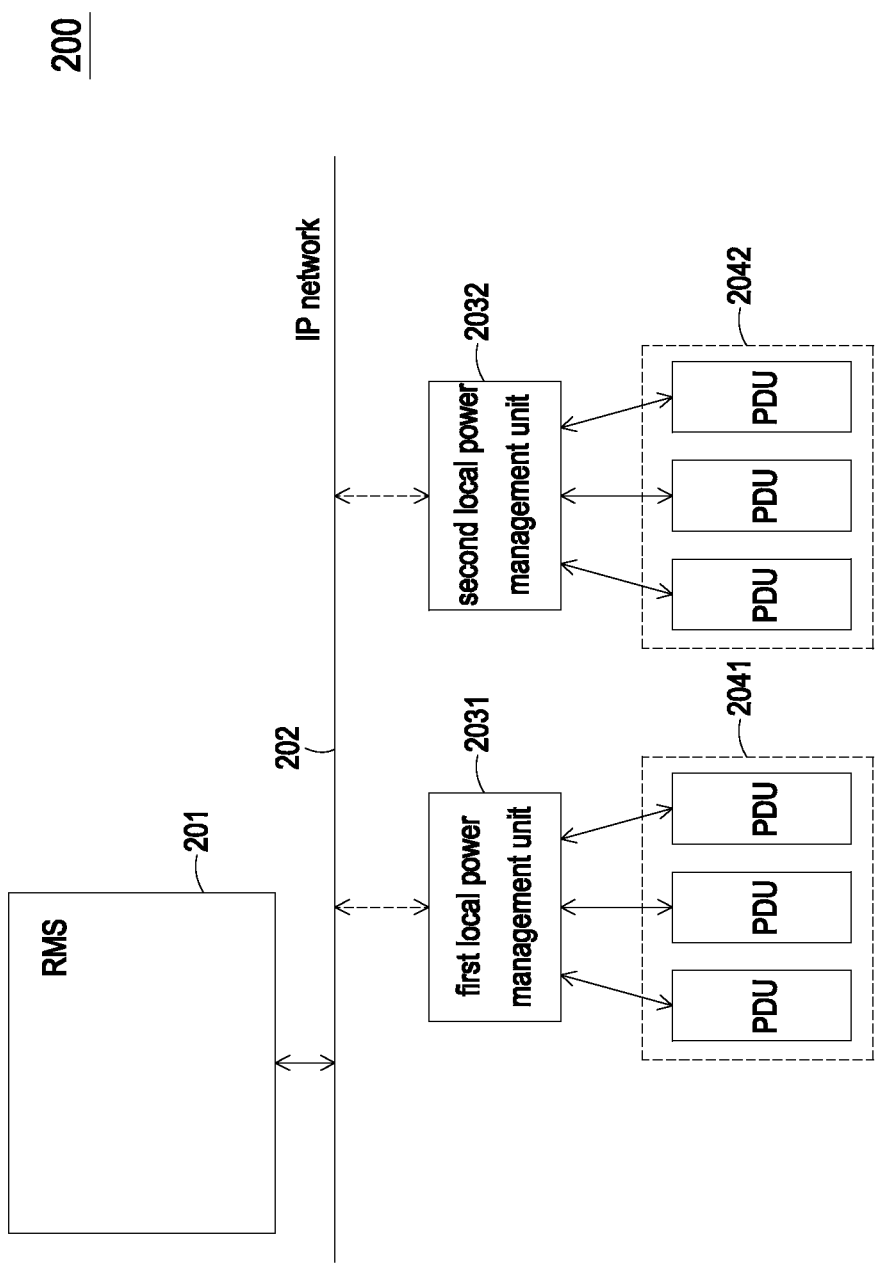
FIG. 2 shows a power management system employing local power management units according to a preferred embodiment of the present invention.
Figure 3:
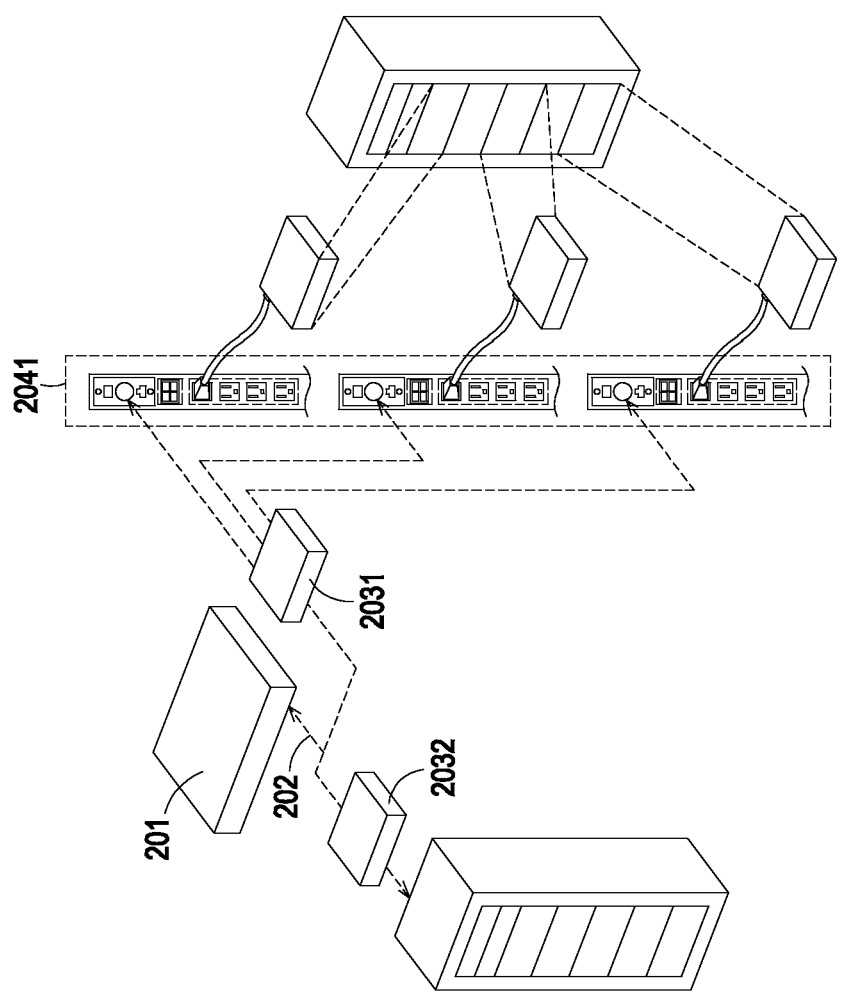
FIG. 3 is a schematic view showing the power management system employing the local power management units of FIG. 2.

FIG. 2 shows a power management system employing local power management units according to a preferred embodiment of the present invention, and FIG. 3 is a schematic view showing the power management system employing local power management units of FIG. 2. As shown in FIGS. 2 and 3, the power management system 200 comprises a RMS 201, a network 202, one or more local power management units 2031, 2032 and a plurality of power distribution units 2041, 2042. In the present embodiment, the power management architecture 200 comprises a first local power management unit 2031 and a second local power management unit 2032. The power distribution units can be divided into a first group of PDUs 2041 and a second group of PDUs 2042. The first group of PDUs 2041 are grouped together and communicated with the first local power management unit 2031 directly to form a first group of devices under a unique and single IP address for all the PDUs 2041. Similarly, a second group of PDUs 2042 are grouped together and communicated with the second local power management unit 2032 to form a second group of devices under a unique and single IP address for all the PDUs 2042. The first local power management unit 2031 and the second local power management unit 2032 are capable of directly communicating with the remote management system (RMS) 201 via an Internet protocol network 202. The network interface of the RMS 201 sends/receives communication data, commands or information to/from the first local power management unit 2031 and the second local power management unit 2032 through IP communication protocol with an unique IP address for each local power management unit 2031, 2032. The RMS 201 is provided as an Internet-based application that communicates with client browsers through web server or communicates with application software through PCs. Each of the first local power management unit 2031 and the second local power management unit 2032 comprises various peripheral communication interfaces capable of communicating with the PDUs having any kinds of communication interface, for example, USB interface, RS-232 interface, RS-499 interface, RS-423 interface, RS-485 interface, Controller-area network (CAN-bus) interface, IEEE 1394 interface, Bluebooth interface, Fibre Channel interface, Infiniband interface, or Ethernet interface, so that the first local power management unit 2031 and the second local power management unit 2032 can also be employed to communicate with conventional PDUs.

Each PDU comprise one or more electrical outlets and sensors that indicate voltage present at the outlets and current flow through each outlet. Each PDU may transmit the operational data or the power consumption information of each outlet thereof to the corresponding local power management unit. The first local power management unit 2031 is a unique on-line resource that provides access to a first group of devices, including wide range of power devices like the first group of PDUs, PSUs, battery racks, sensors and HMI (Human Management Interface), and an uplink network. The uplink network connects to RMS 201 through LAN or WAN. Similarly, the second local power management unit 2032 is a unique on-line resource that provides access to a second group of devices, including wide range of power devices like the second group of PDUs, PSUs, battery racks, sensors and HMI (Human Management Interface), and an uplink network. The uplink network also connects to RMS 201 through LAN or WAN.

Figure 4:
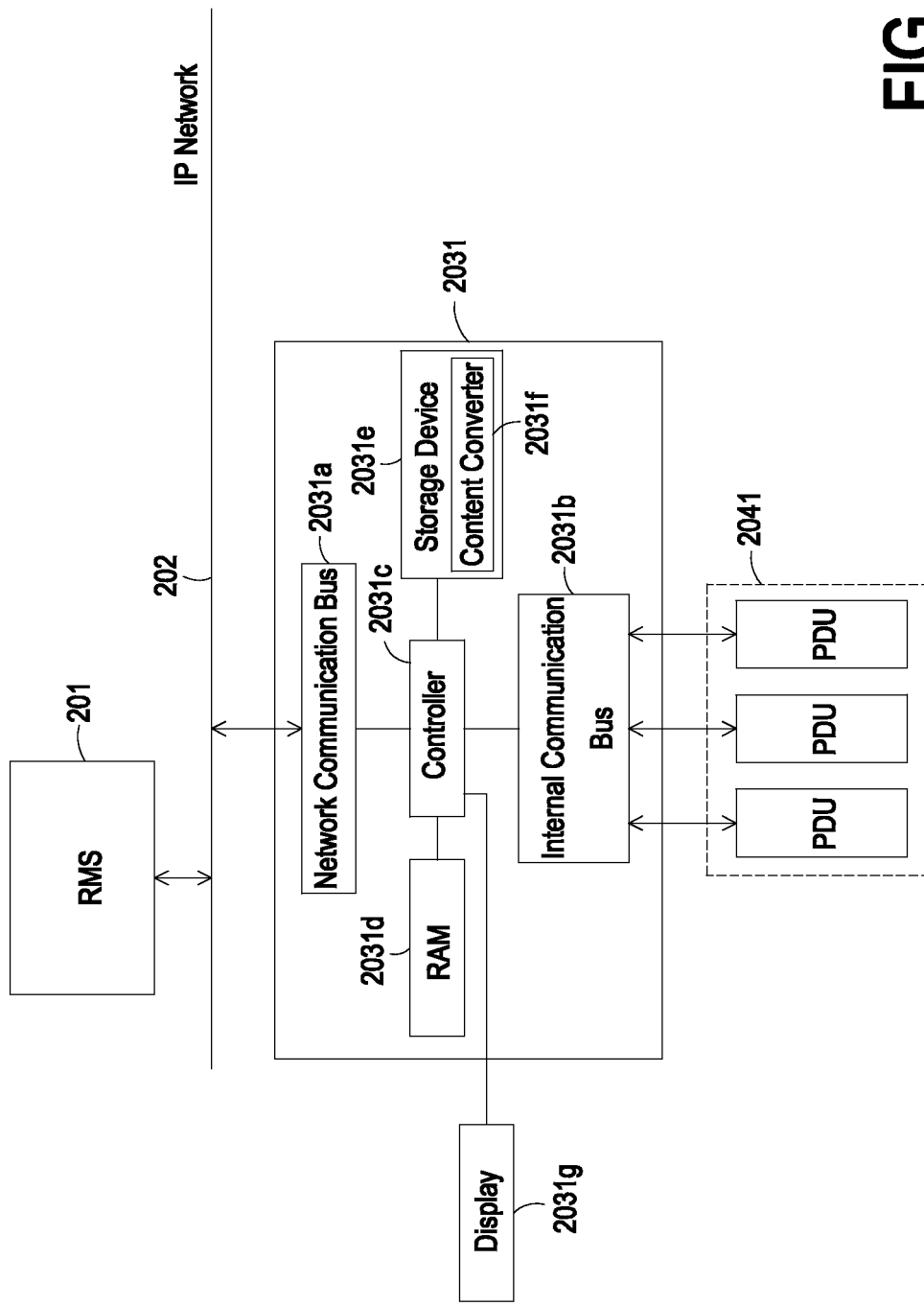
FIG. 4 is a block diagram showing the local power management unit of FIG. 2.

Please refer to FIG. 4, which is a block diagram showing the local power management unit of FIG. 2. As shown in FIG. 4, the first local power management unit 2031 comprises a network communication bus 2031a, an internal communication bus 2031b, a controller 2031c, a RAM 2031d and a storage device 2031e. The network communication bus 2031a is employed for connecting to the RMS 201 via the IP network 202. The internal communication bus 2031b is configured to communicate with the first group of PDUs 2041. In the present embodiment, the internal communication bus 2031b comprises various communication interfaces, for example, USB interface, RS-232 interface, RS-499 interface, RS-423 interface, RS-422 interface, RS-485 interface, CAN-bus interface, IEEE 1394 interface, Bluebooth interface, Fibre Channel interface, Infiniband interface, or Ethernet interface. The controller 2031c is connected to the RAM 2031d, the network communication bus 2031a, the storage device 2031e, and the internal communication bus 2031b for collecting, analyzing, aggregating, and/or unifying the power consumption information and then send the collected data to remote management system 201 so as to reduce the management work loading of the remote management system 201 or ease the processing burden of the remote management system 201. In addition, the controller 2031c can send commands to the PDUs 2041 to condition the power consumption of the PDUs 2041 according to the operation policy profile retained in the storage device 2031e. The storage device 2031e is configured to store the operation policy profiles, which prescribes the setting of the power distribution units and is downloaded from remote management system 201 to the local power management unit 2031 via the IP network 202. It is to be noted that the IP network 202 can be a local area network (LAN) or a wide area network (WAN), and the network communication bus 2031a can be implemented by an Ethernet interface. In addition, the storage device 2031e may store operational data or power consumption information of the PDUs 2041. The RAM 2031d is configured to provide a buffer space for the controller 2031c for temporarily storing computational data required in the operation of the controller 2031c.

Furthermore, the local power management unit 2031 may optionally include an external display 2031g for displaying the operational data and power consumption information of PDUs 2041. The external display 2031g may be implemented by light-emitting diodes (LEDs) or a LCD panel. Moreover, the storage device 2031e further includes a content converter 2031f for converting the data received from the PDUs 2041 into IP data packets adapted for transmission to the RMS 201 through the IP network 202.

Each of the first local power management unit 2031 and the second local power management unit 2032 is prevailing over the prior art in terms of the following advantages:

1. The local power management unit could collect data/information/commands for further communication to RMS if necessary.
2. Multiple sources of operational data or power consumption information from the PDUs, PSUs, battery racks, sensors or HMI (Human Management Interface) could be collected, analyzed, aggregated, and then send to remote management system by the local power management unit so as to save communication overhead and prevent the network from loading a heavy traffic. For example, the average power consumption of a specific PDU can be calculated and then sent to RMS by the local power management unit so that RMS does not need to retrieve the power consumption data continuously and in mass from the specific PDU and calculate the average power consumption of the specific PDU.
3. A content converter of the local power management unit unifies the data or power usage information collected to reduce the management work loading of the remote management system or ease the processing burden on the remote management system.
4. Data and actions could be analyzed and optimized locally within group of devices connected to the local power management unit to make decisions to avoid delay of remote management system for saving response time and the amount of the transmission data under IP network.
5. Operation policy profiles could be downloaded from remote management system to the local power management unit and then the storage device 2031e may retain operation policy profiles, so the local power management unit 2031 may perform the operation policy profile to condition the power supply consumption and manipulate the PDUs 2041.
6. The first group of PDUs are grouped together and communicated with the first local power management unit directly to form a first group of devices under a unique and single IP address for all the first group of PDUs, so that the amount of the IP addresses is reduced compared to the prior art power management architecture.

While the present invention has been described in terms of what are presently considered to be the most practical and preferred embodiments, it is to be understood that the present invention need not be restricted to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A local power management unit connected to a remote management system for regulating a plurality of power distribution units under the administration of the remote management system, comprising:
   an internal communication bus configured to connect to a plurality of power distribution units and proceed to data communication with the plurality of power distribution units through a peripheral communication interface;
   a controller connected to the internal communication bus for collecting and analyzing the operational data or power consumption information received from the plurality of power distribution units through the internal communication bus, and in response thereto outputting the operational data or power consumption information processed by the controller by using a single IP address to the remote management system, and send commands to the plurality of power distribution units to condition the power consumption of the plurality of power distribution units; and
   a network communication bus connected to the controller and the remote management system for transmitting the operational data or power consumption information processed by the controller to the remote management system.

2. The local power management unit according to claim 1 further comprising a storage device connected to the controller configured to store the information received from the plurality of power distribution units.

3. The local power management unit according to claim 2 wherein the storage device further includes a content converter for converting the information processed by the controller into a unified data format for being transmitted to the remote management system.

4. The local power management unit according to claim 2 wherein the storage device is configured to store an operation policy profile prescribing settings of the plurality of power distribution units, and wherein the controller is configured to condition the power consumption of the plurality of power distribution units according to the operation policy profile.

5. The local power management unit according to claim 4 wherein the operation policy profile is downloaded from the remote management system.

6. The local power management unit according to claim 1 further comprising a random access memory connected to the controller for storing computational data required in the operation of the controller.

7. The local power management unit according to claim 1 wherein the internal communication bus further comprises a USB interface, a RS-232 interface, a RS-499 interface, a RS-423 interface, a RS-422 interface, a RS-485 interface, a controller-area network interface, an IEEE 1394 interface, a Bluebooth interface, a Fibre Channel interface, an Infiniband interface, or an Ethernet interface.

8. The local power management unit according to claim 1 wherein the remote management system is allowable to connect to a plurality of local power management units.

9. The local power management unit according to claim 1 further comprising an external display connected to the controller for displaying the processed information.

10. The local power management unit according to claim 1 wherein the local power management unit according to claim 1 wherein the local power management unit is connected to the remote management system through an internet protocol network.

11. The local power management unit according to claim 10 wherein the internet protocol network comprises a local area network or a wide area network, and wherein the network communication bus comprises an Ethernet interface.

12. A power management system for remotely administrating a plurality of power distribution units, comprising:
an internet protocol network;
a remote management system configured to allow an administer to control the power distribution units through the internet protocol network; and
a local power management unit connected to the remote management system through the internet protocol network and connected to the plurality of power distribution units through a peripheral communication interface for collecting and analyzing the operational data or power consumption information of the plurality of power distribution units and in response thereto transmitting the data or information processed therein by using a single IP address to the remote management system through the internet protocol network, and send commands to the plurality of power distribution units to condition the power consumption of the plurality of power distribution units.

13. The power management system according to claim 12 wherein the remote management system is allowable to connect to a plurality of local power management units.

14. The power management system according to claim 12 wherein the internet protocol network comprises a local area network or a wide area network.

15. The power management system according to claim 12 wherein the local power management unit comprises:
an internal communication bus configured to connect to the plurality of power distribution units and proceed to data communication with the plurality of power distribution units through the peripheral communication interface;
a controller connected to the internal communication bus for collecting and analyzing the operational data or power consumption information received from the plurality of power distribution units through the internal communication bus, and in response thereto outputting the operational data or power consumption information processed by the controller by using a single IP address to the remote management system, and send commands to the plurality of power distribution units to condition the power consumption of the plurality of power distribution units; and
a network communication bus connected to the controller and the remote management system for transmitting the operational data or power consumption information processed by the controller to the remote management system through the internet protocol network.

16. The power management system according to claim 15 wherein the local power management unit further includes a storage device connected to the controller configured to store the information received from the plurality of power distribution units.

17. The local power management unit according to claim 16 wherein the storage device further includes a content converter for converting the information processed by the controller into a unified data format for being transmitted to the remote management system.

18. The power management system according to claim 15 wherein the local power management unit further includes a random access memory connected to the controller for storing computational data required in the operation of the controller.

19. The power management system according to claim 15 wherein the local power management unit further includes an external display connected to the controller for displaying the processed information.

* * * * *